United States Patent [19]
Okase

[11] Patent Number: 5,862,302
[45] Date of Patent: Jan. 19, 1999

[54] THERMAL PROCESSING APPARATUS HAVING A REACTION TUBE WITH TRANSPARENT AND OPAQUE PORTIONS

[75] Inventor: Wataru Okase, Sagamihara, Japan

[73] Assignees: Tokyo Electron Limited; Tokyo Electron Tohoku Limited, both of Tokyo-to, Japan

[21] Appl. No.: 847,112

[22] Filed: May 1, 1997

Related U.S. Application Data

[62] Division of Ser. No. 532,059, Sep. 22, 1995, abandoned.

[30] Foreign Application Priority Data

Sep. 28, 1994 [JP] Japan .................................. 6-259108

[51] Int. Cl.$^6$ .............................. F27B 5/14; H01L 21/324
[52] U.S. Cl. ........................ 392/416; 219/390; 219/405; 118/725
[58] Field of Search .................................. 219/390, 405, 219/411; 392/416, 418; 432/152; 118/50.1, 724, 725; 438/795, 796, 799; 373/111

[56] References Cited

U.S. PATENT DOCUMENTS 5,429,498  7/1995  Okase et al. ........................ 432/152

FOREIGN PATENT DOCUMENTS 728850    8/1996   European Pat. Off. .
60-211947 10/1985  Japan .
61-247022 11/1986  Japan .
63-128625  6/1988  Japan .
2-73625    3/1990  Japan .
2-268420  11/1990  Japan .
2-284417  11/1990  Japan .
4-062836   2/1992  Japan .
4-62836    2/1992  Japan .
4-93026    3/1992  Japan .
6-333866  12/1994  Japan .
7-335582  12/1995  Japan .

Primary Examiner—Teresa Walberg
Assistant Examiner—J. Pelham
Attorney, Agent, or Firm—Beveridge, DeGrandi, Weilacher & Young, L.L.P.

[57] ABSTRACT

A heat insulating member is disposed, enclosing a reaction tube, and a heat source is provided through a heat linearing member disposed above the reaction tube and between the reaction tube and the heat insulating member. The reaction tube is made of quartz and has a transparent portion formed in the top thereof and its neighboring thereof, and an opaque portion in the rest part of the reaction tube. In a heat treatment, when heat rays are radiated from the heat source through the heat linearing member, the heat rays pass through the transparent portion of the reaction tube to heat a wafer, but those of the heat rays reflected on the heat insulating member are blocked by the opaque portion of the reaction tube. A heat ray quantity to be passed into the reaction tube can be controlled, whereby high intra-surface temperature uniformity of the wafer can be secured, and as a result high processing yields can be obtained.

3 Claims, 6 Drawing Sheets

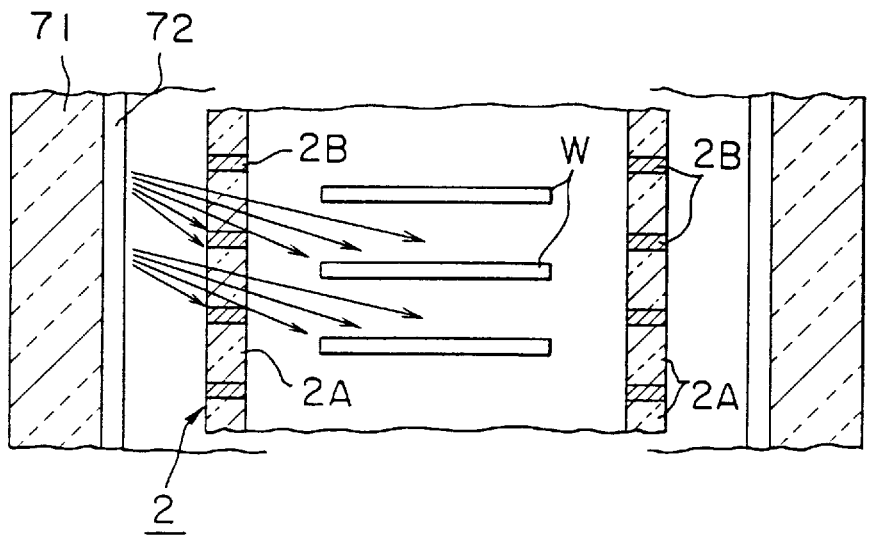
F I G. 5
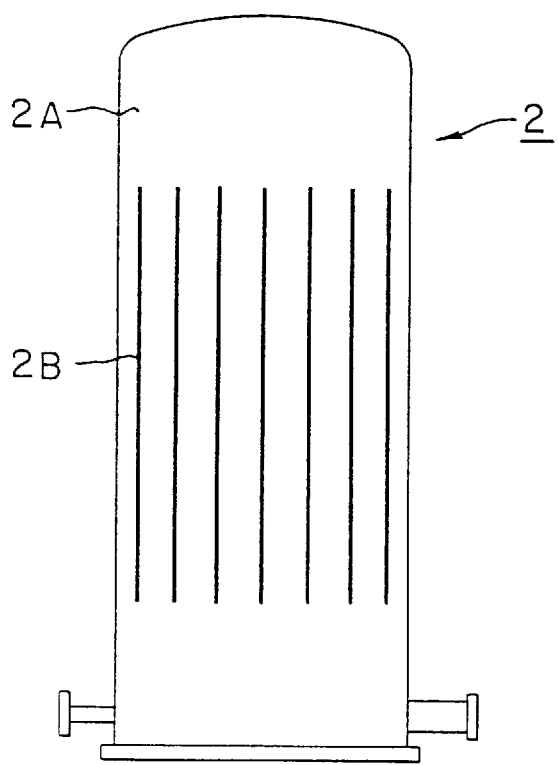
F I G. 6

THERMAL PROCESSING APPARATUS HAVING A REACTION TUBE WITH TRANSPARENT AND OPAQUE PORTIONS

This application is a division of Ser. No. 08/532059 filed Sep. 22, 1995 now abandoned.

BACKGROUND OF THE INVENTION

The present invention relates to a processing apparatus for processing an object to be processed.

The conventional semiconductor device fabrication process includes oxidation processing by which the surface of silicon of a device is oxidized at a high temperature to form an oxide film (insulating film), diffusion processing by which a silicon layer with an impurity layer formed on the surface thereof is heated to thermally diffuse the impurity in the silicon layer, and other processing.

As a heat treatment apparatus for such oxidation and diffusion, a batch vertical heat treatment apparatus is known. In forming, e.g., an oxide film for a capacitance insulating film and a gate oxide film, and diffusion of impurity ions, qualities, film pressure and diffusion depths of the films are much affected by thermal budgets in cases that the films are jointed very thin, and the junctions are shallow.

As an improvement of the above-described batch heat treatment furnace a sheet heat treatment apparatus in which wafers are carried one by one on holding means into the reaction tube to a set position and quickly heated there is being studied. Such sheet heat treatment apparatus will be explained with reference to the schematic view of FIG. 7.

In FIG. 7, reference numeral 1 represents a reaction tube of transparent quartz glass, and wafer holding means 11 is disposed vertically movable in the reaction tube 1. A heat insulating member 12 encloses the reaction tube 1 on the outside thereof. Above the reaction tube 1 there is provided a heater 14 in the form of a resistance heater through a heat linearing member 13 made of, e.g., an SiC (silicon nitride) plate. Reference numeral 15 denotes a processing gas feed pipe. Reference numeral 16 indicates an exhaust pipe. Reference numerals 17a–17c represent a water jacket.

In such sheet heat treatment apparatus, essentially one sheet of wafer W is first mounted on wafer holding means 11 by carrying means in a transfer chamber below the reaction tube 1, and the wafer holding means 11 is lifted to a set position. On the other hand, the heat linearing member 13 is heated by the heater 14, and the wafer W is heated to a prescribed temperature by radiation of the heat linearing member 13. A processing gas is fed through the processing gas feed pipe 15 for, e.g., oxidation. The reacted processing gas is discharged through the exhaust pipe 16 out of the system. The reaction tube 1 and the heat insulating member are water-cooled by water supplied to the water jackets 17a–17c.

In this sheet heat treatment apparatus, the heating source for the wafer W is the plate-shaped heat linearing member 13, but in addition to heat rays radiated from the heat source directly to the wafer W, heat rays which are reflected on the inside wall of the heat insulating member 12 and radiated to the wafer W are also present. The apparatus is designed by considering only heat rays which are radiated from the heat source directly to the wafer W opposed to the heat source are considered in connection with a distance between the wafer W and the heat source, a heat quantity of the heat source, etc., whereby high uniformity of intra-surface temperature distribution of the wafer W can be secured.

Actually, however, heat rays reflected on the heat insulating member 12 are radiated to the wafer W, which makes the apparatus design very difficult to secure high uniformity of intra-surface temperatures of the wafer W. This sets a limit to improvement of the intra-surface temperature uniformity. On the other hand, as devices are increasingly integrated, patterns of the devices are more micronized, and the layers are made increasingly thinner. There is a tendency that the wafer size is increased from 6 inches to 8 inches and to 12 inches. For example, very thin films as thin as 50 Å are formed on devices. In such case, some Å-film thickness deflections are problems. Thus, such processing requires very high intra-surface temperature uniformity. The above-described heat treatment apparatus has found it difficult to meet the above-described requirement especially as wafers have larger diameters. A problem is consequent inevitable lower yields.

SUMMARY OF THE INVENTION

The present invention was made in the above-described circumstances. An object of the present invention is to provide a heat treatment apparatus which can secure high uniformity of intra-surface temperatures of an object to be treated, whereby yields of treatments can be improved.

The present invention relates to a processing apparatus for loading an object to be processed into a reaction vessel and processing the object by radiation energy from a radiation source disposed outside the reaction vessel, the apparatus being characterized in that the reaction vessel includes a transparent portion and an opaque portion so that a uniform temperature distribution can be obtained in a surface-to-be-processed of the object to be processed.

The present invention relates to a processing apparatus for loading an object to be treated into a reaction vessel and heat-treating the object by radiation heat from a heat source disposed outside the reaction vessel, the apparatus being characterized in that the reaction vessel including a transparent portion and an opaque portion so that a uniform temperature distribution can be obtained in a surface-to-be-treated of the object to be treated.

As in the present invention, by providing the transparent and the opaque portion in the reaction vessel, radiation energy from the radiation source passes through the transparent portion but is hindered from passing through the opaque portion, whereby the radiation energy can be controlled by the reaction tube. Accordingly high intra-surface temperature uniformity of an object to be processed can be secured, whereby high yields can be obtained.

BRIEF DESCRIPTION OF THE DRAWINGS

FIG. 5 is a view explaining states of passage of the heat rays into the reaction tube.

FIG. 6 is a side view of a reaction tube according to a further embodiment of the present invention.

DETAILED DESCRIPTION OF PREFERRED EMBODIMENTS

Figure 1:
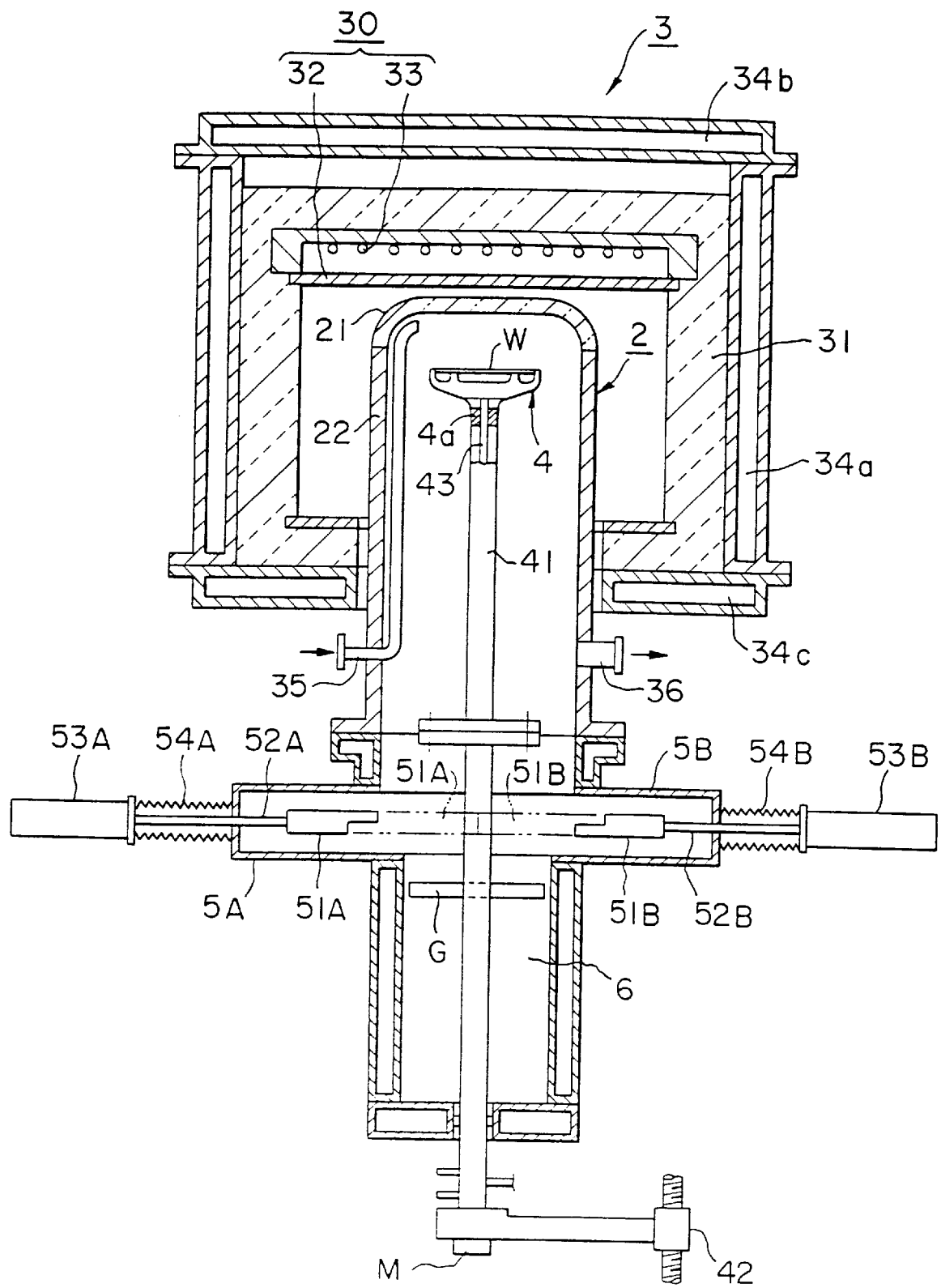
FIG. 1 is a vertical sectional view showing a general structure of the sheet heat treatment apparatus according to one embodiment of the present invention.
Figure 2:
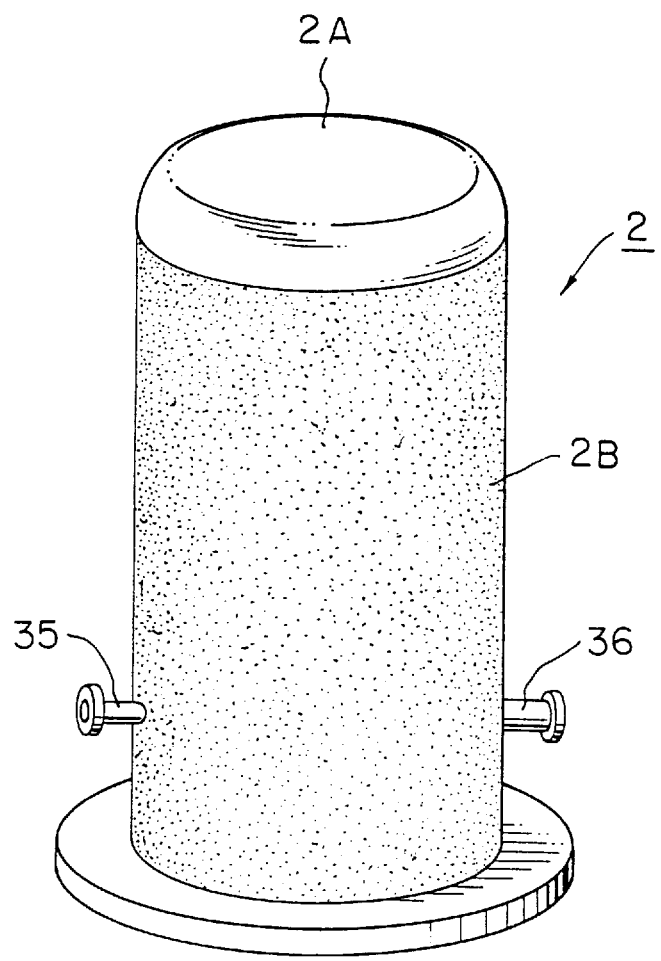
FIG. 2 is a perspective view of a reaction tube of the sheet heat treatment apparatus of FIG. 1.

FIG. 1 is a view of the general structure of the sheet heat treatment apparatus according to one embodiment of the present invention. First the general structure of the sheet heat treatment apparatus according to the present embodiment will be explained. Reference numeral 2 represents a reaction tube of, quartz, e.g., synthetic quartz glass, molten quartz glass or others, which has a thickness of, e.g., 3–5 mm and has the bottom opened and the top closed. The reaction tube 2 provides a processing chamber in which heat treatments are conducted on an object to be treated, e.g., a semiconductor wafer W. As shown in FIG. 2, the reaction tube 2 has the top (ceiling) and its neighboring part formed in a transparent part 21 and has the reset part thereof, such as the side walls, etc., formed in an opaque part 22. The synthetic quartz forming the reaction tube 2 is synthesized by oxyhydrogen flame, radio-frequency inducted plasma, etc., using a silicon compound, such as silicon tetrachloride, as a base material. The molten quartz glass is produced by a melting method, such as oxyhydrogen flame melting method, electric vacuum melting method, etc., using quartz as a base material. The opaque part 21 of the reaction tube 2 and the opaque part thereof are formed by, e.g., differing a pressure in a mold for forming the reaction tube 2 between a part of the reaction tube 2 to be the transparent part and a part thereof to be the opaque part when the reaction tube 2 is formed. Being opaque means having lower transparency than being transparent, and includes opaqueness which does not allow heat rays from the later-described heat source to substantially pass through, and semi-opaqueness. It is also possible to form the transparent portion and the opaque portion separately, and later both parts are integrated by, e.g., welding into the reaction tube 2.

A heating furnace 3 is disposed outside the reaction tube 2 with a gap therebetween, surrounding the reaction tube 2. The heating furnace 3 comprises a vessel in the form of a heat insulating member 31 of, e.g., alumina, surrounding the reaction tube 2, a plate-shaped heat soaking member 32 of, e.g., SiC disposed inside the heat insulating member 31, and outside and above the reaction tube 2 on the side of incidence of heat rays from the heater 33, a heater 33 of, e.g., resistance heating wires, and the water jackets 34a –34c disposed outside the heat insulating member 31. In this embodiment the heat linearing member 32 and the heater 33 constitute a heat source 30.

A wafer mount (boat) 4 is disposed in the reaction tube 2. The wafer mount 4 is disposed on the top of a lift rod 41. The lift rod 41 is moved up an down by a lift mechanism, such as a ball screw provided on the lower end thereof below the heat treatment apparatus body. The lift rod 41 has a rotary shaft 43 inside thereof. The rotary shaft 43 is rotated by a motor M, and the wafer mount 4 is rotated. A seal structure 4a is provided between the outer periphery of the lift rod 41 and the rotary shaft 43 for preventing intrusion of a processing gas in the lift rod 41. A processing gas feed pipe 35 is provided in the reaction tube 2 for feeding the processing gas from processing gas sources onto a wafer W on the wafer mount 4, and an exhaust pipe 36 is connected to the reaction tube 2 for exhausting the interior of the reaction tube 2.

Below the reaction tube 2 there are provided shutter chambers 5A, 5B as stand-by chambers projected on the left and the right sides. The shutter chambers 5A, 5B respectively accommodate shutters 51A, 51B which are divided in the left and the right ones for air-tightly shutting the interior of the reaction tube 2 from a transfer chamber 6 which will be explained later. The shutters 51A, 51B are advanced and withdrawn through the path of the wafer mount 4 and the shutter chambers 5A, 5B on the left and right sides of the path by hydraulic cylinders 53A, 53B through pistons 52A, 52B which are passed through the side walls of the shutter chambers 5A, 5B. Reference numerals 54A, 54B represent bellows which protect the pistons 52A, 52B.

The transfer chamber 6 for a wafer W is located below the shutter chambers 5A, 5B. The transfer chamber 6 is a space where a wafer W is transferred by a carrier arm through a gate valve G between the transfer chamber 6 and a load-lock chamber not shown here (one is a loading chamber, the other being an unloading chamber) which is arranged from the front to the back of the transfer chamber 6 when the shutters 51A, 51B are advanced and withdrawn left and right.

Then, the operation of the sheet heat treatment apparatus according to the present embodiment will be explained. The interior of the reaction tube 2 is evacuated in advance to a low pressure of, e.g., 600 –900 Torr. Next, the wafer mount 4 is positioned in the transfer chamber 6, and an object to be treated, e.g., a semiconductor wafer W is transferred onto the wafer mount 4 by the carrier arm from the outside load-lock chamber through the gas valve G. Then, the wafer mount 4 is lifted to a thermal CVD region which is beforehand set in the reaction tube 2, the shutters 51A, 51B are advanced to close the path to thereby shut the reaction tube 2 from the transfer chamber 6.

On the other hand, the heat linearing member 32 is heated by the heater 33, and heat rays are radiated from the heat linearing member 32. As shown, a part of the heat rays pass through the transparent portion 21 of the reaction tube 2, and reach the wafer W and rapidly heat the wafer W to a prescribed temperature. Most of those heat rays radiated by the heat linearing member 32 which have been reflected on the inside of the wall of the heat insulating member 31 are blocked by the opaque portion 22 and prevented from passing into the reaction tube 2. Thus heat rays which contribute to the heating of the wafer W are limited to heat rays which pass into the reaction tube 2 from the heater 33 through the heat linearing member 32.

The wafer W is thus heated up to the prescribed temperature while a prescribed processing gas, e.g., HCl gas and $H_2O$ is fed through the processing gas feed pipe 35 onto the surface of the wafer W, and the silicon layer on the surface of the silicon wafer W is oxidized with the interior of the reaction tube 2 set at, e.g., 760 Torr. When this oxidation treatment is over, the shutters 51A, 51B are withdrawn to open the path and lower the wafer mount 4 into the transfer chamber 6. Then the treated wafer W is carried into the outside load-lock chamber through the gate valve G, and then a next sheet of wafer W is placed on the mount 4.

In the above-described sheet heat treatment apparatus an incident path of heat rays from the heater 33, e.g., only the top of the reaction tube 2 and its neighboring part thereof are transparent, and the rest part is opaque, so that most of the heat rays reflected on the inside of the wall of the heat insulating member 31 are blocked by the opaque portion 22 of the reaction tube 2. As a result, a restricted quantity of the heat rays reach the wafer W. For the improvement of intra-surface temperature uniformity of the wafer W, this facilitates design of the apparatus in consideration of, e.g., sizes of the heat linearing member 31, distances between the heat linearing member 31 and the wafer W, etc. Consequently high intra-surface temperature uniformity of the wafer W can be secured, and accordingly yields can be improved.

In the above-described embodiment, the top of the reaction tube 2 and its neighboring part thereof are made transparent, but a point of the present invention does not lie in where the transparent portion is provided, but in that the transparent portion and the opaque portion are provided on the reaction tube 2, and unnecessary heat rays entering the reaction tube 2 from the outside are blocked by a layout of the transparent and the opaque portions to let only necessary heat rays, for example, into the reaction tube 2, whereby high intra-surface temperature uniformity of the wafer W can be obtained. A layout pattern of both portions is set corresponding to a shape of the heat source 33, a relative distance between the wafer W and the heat source 33 (the heat linearing member 32 in the above-described embodiment), etc.

Figure 3A:
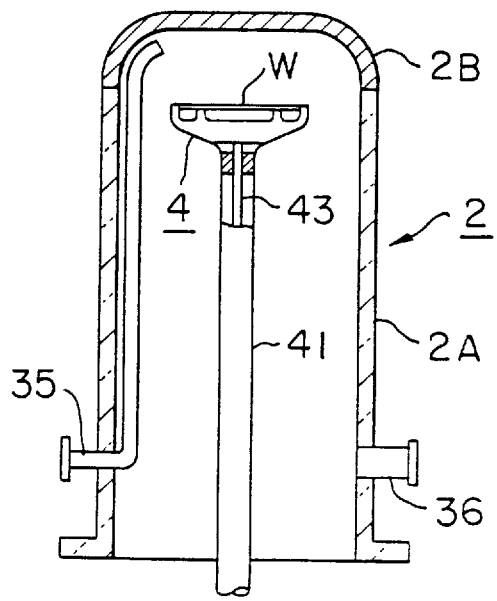
FIGS. 3A to 3C are view of layouts of the transparent portion and the opaque portion of the reaction tube of the sheet heat treatment apparatus of FIG. 1.
Figure 3B:
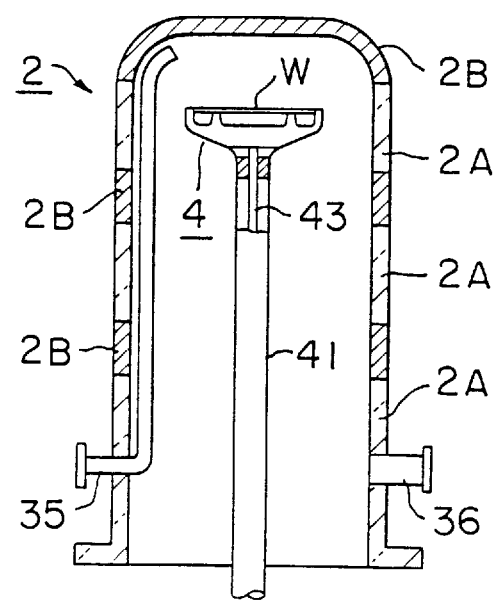
Figure 3C:
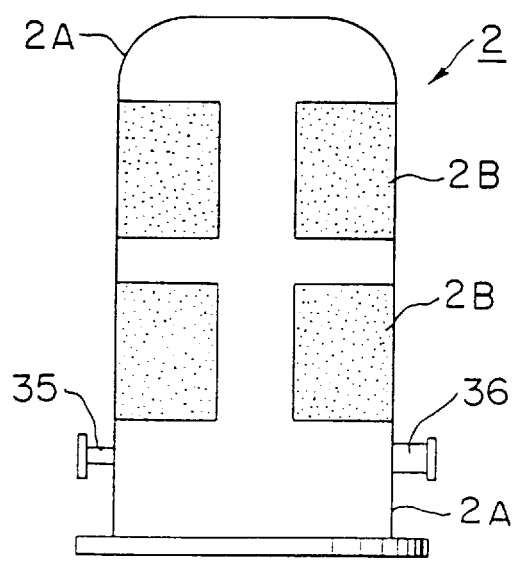

Accordingly, a layout pattern of the transparent and the opaque portions of the reaction tube 2 can be as exemplified in FIG. 3A. That is, an opaque portion 2B is formed on the top of the reaction tube 2 and its neighboring part thereof, and the rest part of the reaction tube 2 is a transparent portion 2A. As shown in FIG. 3B, an opaque portion 2B is formed on the top of the reaction tube 2 and its neighboring part thereof, and opaque portions 2B in the form of bands circumferentially extended on the reaction tube 2 and vertically spaced from each other by a certain interval while transparent portions 2A are formed on parts of the reaction tube 2 corresponding to a treatment position. In addition, as shown in FIG. 3C, some opaque portions 2B are formed in some patches on the side wall of the reaction tube 2.

Figure 4:
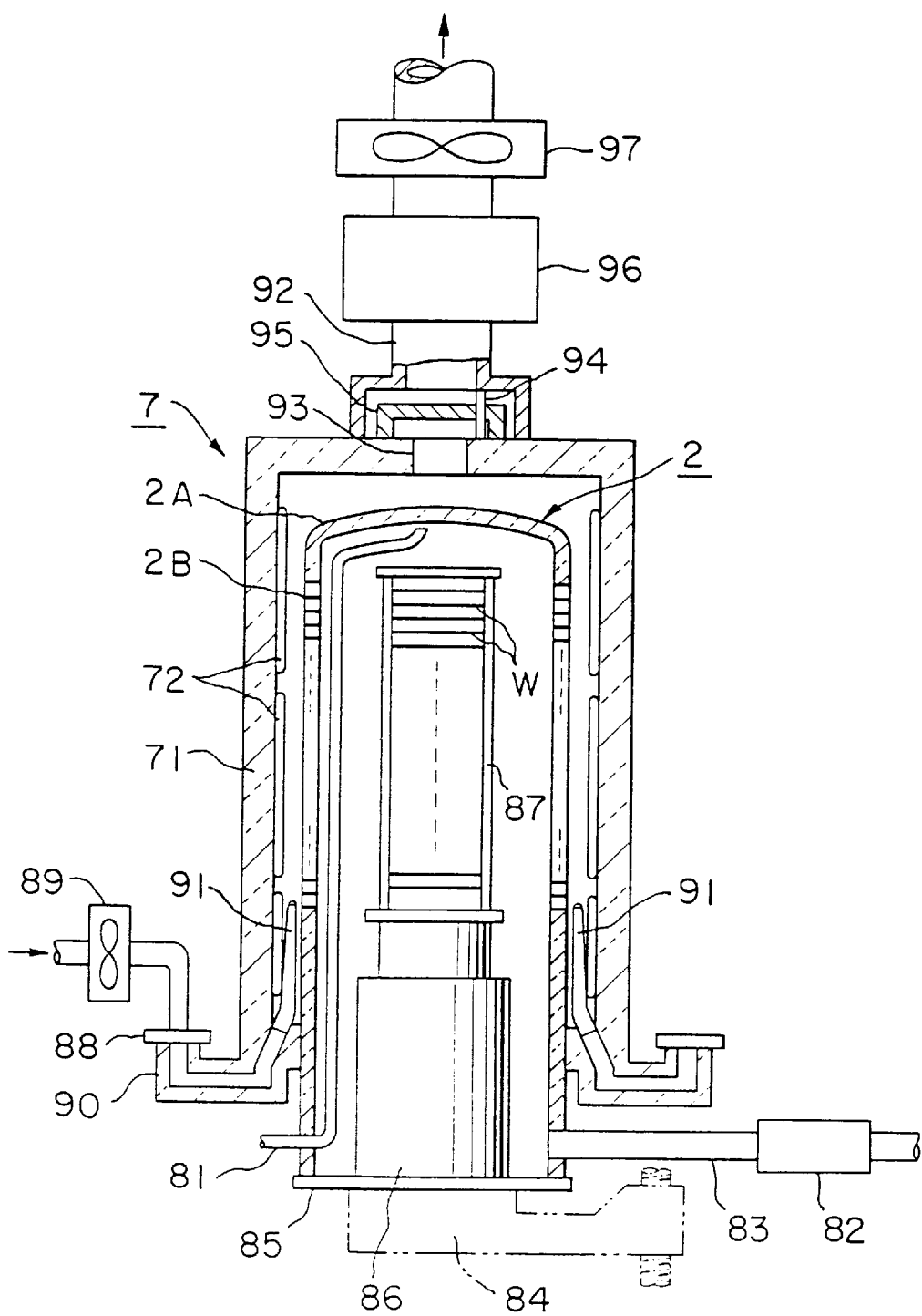
FIG. 4 is a vertical sectional view of the vertical heat treatment apparatus according to another embodiment of the present invention, which shows a general structure thereof.
Figure 7:
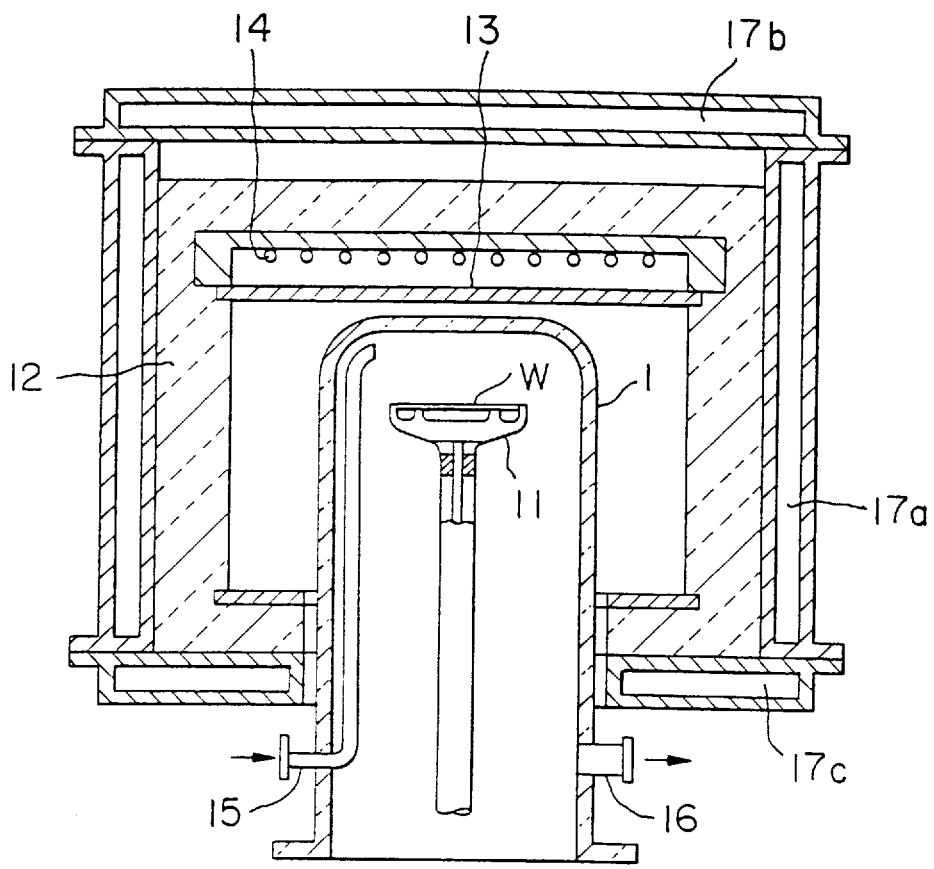
FIG. 7 is a vertical sectional view of the conventional sheet heat treatment apparatus which shows its general structure.

The vertical (batch) heat treatment apparatus which is suitable to carry out the present invention will be explained with reference to FIGS. 4 and 5. In FIG. 4 reference numeral 2 represents a cylindrical reaction tube the lower end of which is opened and the upper end of which is closed. The reaction tube 2 is made of, egg., quartz, such as synthetic quartz glass, molten quartz glass or others, as in the above-described first embodiment. As exemplified in FIG. 5, band-shaped opaque portions 2B are circumferentially extended on the reaction tube 2 spaced vertically from each other. A band width of the opaque portions 2B and the space between the opaque portions 2B are set so that part of heat rays from a heat source which will be explained later is blocked to apply heat rays corresponding to a prescribed heat linearing pattern to wafers W on the wafer boat 87, whereby a uniform intra-surface temperature distribution can be obtained.

As shown in FIG. 4, a heating furnace 7 encloses the reaction tube 2. The heating furnace 7 comprises a plurality of steps of heating blocks each constituted by a heater 72, e.g., a resistance heat wire vertically wound circumferentially along the inside circumferential surface of a heat insulating member 71. The heater 72 can be made of, e.g., molybdenum bisilicate (MoSi$_2$), which makes it possible to raise a temperature inside the reaction tube 2 at a high temperature increasing rate of 50°–100° C./min.

A processing gas feed pipe 81 connected to gas sources is projected in the reaction tube 2 with the forward end extended and opposed to the ceiling of the reaction tube 2. An exhaust pipe 83 connected to a vacuum pump 82 is disposed in the reaction tube 2. Below the reaction tube 2 there is provided a cap 85 mounted on a lift 84. The cap 85 acts to air-tightly close the bottom opening of the reaction tube 2 at its uppermost position. The wafer mount 85 as holding means is disposed on the cap through a heat insulating cylinder 86.

Air suction passages 90 which are opened in the outside through shutters 88 or connected to air blower fans 89 are provided between the lower end of the heating furnace 7 and the reaction tube 2 and at four positions along the circumference of the reaction tube 2. Nozzles 91 are provided at the forward ends of the air suction passages 90. An exhaust port which is in communication with an exhaust duct 92 is provided in the upper surface of the heating furnace 7. The exhaust duct 92 includes a shutter 95 which is turnable on a pin 94 for opening and closing the exhaust duct 92, a heat exchanger 92 and an exhaust fan 97 in the stated order from the upstream. The air suction passages 90 and the exhaust duct 92 constitute forced cooling means for forcedly cooling the interior of the reaction tube after film deposition is over on the wafers W.

In this vertical heat treatment apparatus, for example, the interior of the reaction tube 2 is heated up to, e.g., 850° C., and 30 sheets of semiconductor wafers W are loaded on the wafer boat 87 into the reaction tube 2, and then the interior of the reaction tube 2 is heated up to, e.g., about 1000° C. at a temperature increasing rate of 100° C./ min. and a prescribed processing gas is fed into the reaction tube 2 for an oxidation. In this treatment, heat rays radiated by the heater 72 of the heating furnace 7 outside the reaction tube 2 pass through the transparent portion 2A of the reaction tube 2 and arrive at the wafers W to heat the same. The opaque portion 2B of the reaction tube 2 does not transmit the heat rays. The heat rays from the heater 72 are thus controlled by the reaction tube 2 to arrive at the peripheral edges of the wafers W to heat the wafers W to a prescribed temperature.

In the above-described vertical heat treatment apparatus, the band-shaped opaque portions extended along the circumference of the reaction tube 2 are formed on the reaction tube 2, vertically spaced from each other, whereby heat rays from the heater pass through the entire tubular wall of the reaction tube 2 but are blocked by the opaque portion 2B (e.g., by a size of ½ a wafer's arrangement pitch). In the conventional vertical heat treatment apparatus, the reaction tube 2 is entirely transparent, and since wafers W are arranged one above the other and near each other, each wafer W is hidden by its above one, and a central part of each wafer W receives more radiation heat from the heater than a peripheral portion thereof. Accordingly some disuniformity of intra-surface temperatures of the wafers is unavoidable. In contrast to this, in the above-described embodiment, the opaque portion 2B is suitably formed, whereby a radiation heat quantity in the surfaces of the wafers W can be controlled. Accordingly patterns of high and low temperatures in the surfaces of the wafers W can be levelled off. As a result, uniformity of intra-surface temperatures of the wafers W can be improved, and higher yields are accordingly obtained.

In the above-described vertical heat treatment apparatus, as exemplified in FIG. 6, slit-shaped opaque portions 2B (e.g., having a width of $\frac{1}{10}$ a diameter of the reaction tube) which are vertically elongated may be formed in the central part of the reaction tube 2 except the upper and lower end portions thereof, circumferentially spaced from each other. In this case, heat rays radiated by the heating furnace 7 are blocked by the opaque portions 2B, so that a heat quantity of the radiation heat to be applied to the central part of interior of the reaction tube 2 can be lowered. In the conventional heat treatment apparatus, the upper and the lower end portions of the interior of the reaction tube 2 which are remote from the heating furnace 7 tend to have a little lower temperatures than the central part of the interior of the reaction tube 2. The arrangement of FIG. 6 can control a heat quantity to be applied to the central part of the interior of the reaction tube 2 to be substantially equal to that to be applied to the upper and the lower end portions. As a result, inter-wafer surface temperature uniformity can be improved.

The present invention described above is applicable not only to the above-described sheet heat treatment apparatus and the vertical batch heat treatment apparatus, but also to horizontal heat treatment apparatuses, optical CVD apparatuses in which photo-energy is applied from a light source, such as an excimer laser, UV lamp or others, to wafers mounted on, e.g., an susceptor, and a reaction gas is decomposed by the photo-energy to generate deposition or reactive molecules. The present invention is applicable not only a cylindrical reaction tube, but also to barrelshaped reaction tubes. The energy source can be provided by lamps, resistance heat bodies, heat linearing members, and substances which generate radiation energy, such as heat, light, etc. The present invention is applicable to oxidation, diffusion, CVD, ethcing, sputtering, ashing, annealing, etc.

What is claimed is:

1. A processing apparatus comprising:

a reaction tube;

loading means for loading an object-to-be-processed into the reaction tube, and processing means for processing the object by radiation energy, the processing means including a radiation source disposed outside the reaction tube, the reaction tube having a transparent part, and an opaque part so that a uniform temperature distribution can be obtained in a surface-to-be-processed of the object to be processed, the transparent part including transparent portions, the opaque part including a top part of the reaction tube and a neighboring part thereof, and band-shaped portions which extend along a circumference of the reaction tube and are vertically spaced from each other by the transparent portions, the loading means loading objects-to-be processed into the reaction tube so that the objects are positioned in areas of the opaque part.

2. A processing apparatus comprising:

a reaction tube;

loading means for loading an object-to-be processed into the reaction tube; and processing means for processing the object by radiation energy, the processing means including a radiation source disposed outside the reaction tube, the reaction tube having a transparent part, and an opaque part so that a uniform temperature distribution can be obtained in a surface-to-be-processed of the object to be processed, the transparent part including transparent portions, the opaque part including patched portions, the patched portions being spaced from each other by the transparent portions such that the patched portions do not extend circumferentially around the reaction tube, the patched portions and the transparent portions being on side walls of the reaction tube.

3. A processing apparatus comprising:

a reaction tube;

loading means for loading an object-to-be processed into the reaction tube; and processing means for processing the object by radiation energy, the processing means including a radiation source disposed outside the reaction tube, the reaction tube having a transparent part, and an opaque part so that a uniform temperature distribution can be obtained in a surface-to-be processed of the object to-be-processed, the transparent part having transparent portions, the opaque part including slit-shaped opaque portions which extend vertically only in a central part of the reaction tube, and which circumferentially are spaced apart from each other by the transparent portions.

* * * * *